US010152096B1

(12) United States Patent
Chen et al.

(10) Patent No.: US 10,152,096 B1
(45) Date of Patent: Dec. 11, 2018

(54) COOLING LIQUID DISTRIBUTION DEVICE (71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/871,177

(22) Filed: Jan. 15, 2018

(30) Foreign Application Priority Data

Dec. 15, 2017 (TW) .............................. 106144225 A (51) Int. Cl.
G06F 1/16 (2006.01)
H05K 5/00 (2006.01)
H05K 7/00 (2006.01)
G06F 1/18 (2006.01)
H05K 7/14 (2006.01)
G11B 33/02 (2006.01)

(52) U.S. Cl.
CPC .............. *G06F 1/187* (2013.01); *G11B 33/02* (2013.01); *H05K 7/1427* (2013.01)

(58) Field of Classification Search
CPC . G06F 1/187; G06F 1/20; G06F 1/203; G06F 1/206; H05K 7/20272; H05K 7/20218; H05K 7/20327; H05K 7/20554; H05K 7/20627; H05K 7/20663; G11B 33/02

USPC .......................... 361/679.53, 699, 724–727, 361/679.33–679.39
See application file for complete search history.

(56) References Cited

U.S. PATENT DOCUMENTS

| 4,698,728 | A | * | 10/1987 | Tustaniwskyj | ..... | H05K 7/20272 165/104.31 |
| 7,011,143 | B2 | * | 3/2006 | Corrado | .................... | G06F 1/20 165/104.33 |
| 7,158,039 | B2 | * | 1/2007 | Hayashida | ............... | G01M 3/16 340/605 |
| 8,208,258 | B2 | * | 6/2012 | Campbell | ............ | H05K 7/2079 165/104.33 |
| 8,351,206 | B2 | * | 1/2013 | Campbell | .......... | H05K 7/20809 361/691 |
| 8,369,090 | B2 | * | 2/2013 | Chester | ............. | H05K 7/20772 361/699 |
| 9,854,713 | B2 | * | 12/2017 | Krug, Jr. | ............ | H05K 7/20781 |

(Continued)

Primary Examiner — Anthony M Haughton
(74) Attorney, Agent, or Firm — WPAT, PC (57) ABSTRACT A cooling liquid distribution device includes a storage tank, a liquid level detector and a liquid level displaying structure. The storage tank includes a first chamber for storing a cooling liquid. When a liquid level of the cooling liquid in the first chamber is detected by the liquid level detector, a liquid level detection result is generated. The liquid level displaying structure includes a second chamber, which is in fluid communication with the first chamber. Consequently, a liquid level of the cooling liquid in the second chamber is equal to the liquid level of the cooling liquid in the first chamber. The liquid level displaying structure is optically transmissible, and thus the liquid level of the cooling liquid in the second chamber is visible through the liquid level displaying structure. The storage amount of the cooling liquid can be realized by the user more easily.

15 Claims, 4 Drawing Sheets (56) References Cited

U.S. PATENT DOCUMENTS

| | | | | |
|---|---|---|---|---|
| 10,098,260 B2* | 10/2018 | Bouras | ............... | H05K 7/20381 |
| 2015/0131228 A1* | 5/2015 | Ishikawa | ............... | G01M 3/047 |
| | | | | 361/699 |
| 2015/0156921 A1* | 6/2015 | Yokohata | ........... | H05K 7/20281 |
| | | | | 165/281 |
| 2016/0379852 A1* | 12/2016 | Tustaniwskyj | .... | H01L 21/67109 |
| | | | | 165/296 |
| 2017/0034950 A1* | 2/2017 | Sung | ........................ | G06F 1/20 |
| 2018/0049345 A1* | 2/2018 | Huang | .................... | G01F 23/38 |

* cited by examiner

COOLING LIQUID DISTRIBUTION DEVICE

FIELD OF THE INVENTION

The present invention relates to a water-cooling heat dissipating device, and more particularly to a cooling liquid distribution device.

BACKGROUND OF THE INVENTION

With increasing development of science and technology, various electronic devices (or computers) such as notebook computers, desktop computers or network servers have become indispensable devices in daily lives of people. Generally, during the operation of the electronic device, the temperature of the electronic components of the electronic device gradually increases. The elevated temperature may result in damage of the electronic components. For solving these problems, the electronic device is usually equipped with a heat dissipating mechanism. In accordance with a conventional heat dissipating mechanism, a fan is used to produce airflow to cool the electronic component through convection, or a heat dissipating unit made of a special material is attached on the electronic component to reduce the temperature through thermal conduction. In addition, a water cooling mechanism is one of the effective and common heat dissipating mechanisms.

The operating principles of the water cooling mechanism will be described as follows. Generally, the water cooling mechanism uses liquid (e.g., water or coolant) as the cooling medium, and uses a continuously-running pump to flow the liquid within an applied system along a circulating loop. The liquid flows along sealed pipes. The pipes are distributed to the surfaces of the electronic components (e.g., the central processing unit). When the liquid with the lower temperature flows through the electronic component with the higher temperature, the liquid absorbs the heat from the electronic component to decrease the temperature of the electronic component. Then, through heat exchange, the heat is released from the pipes to the surroundings or another heat dissipating mechanism. Consequently, the temperature of the liquid is decreased. Then, the liquid flows back to the system and flows along the circulating loop to remove the heat.

For example, a rack coolant distribution unit (also abbreviated as Rack CDU) is one of the water cooling devices used in the server. By the distribution unit, the cooling liquid is directly transmitted to plural cold plates of a server rack through plural pipes simultaneously. Consequently, the electronic components (e.g., a central processing unit) on the cold plates are cooled by the cooling liquid. After the cooling liquid is outputted from the distribution unit, the cooling liquid is transmitted through the associated pumps, the sealed loops and the back-end heat exchange mechanisms. Consequently, the cooling liquid is continuously inputted into the server rack to remove the heat from the server rack.

Moreover, an external loop of the distribution device comprises a cooled liquid inlet and a heat liquid outlet. The external loop is extended to the outside of the serve rack and connected with the back-end cooling pipe. The cold plates are arranged in a vertical stack form. Each cold plate also comprises a cooled liquid inlet and a heat liquid outlet. These cold plates are connected with a cooled liquid inlet and a heat liquid outlet of an inner loop in parallel through an expansion pipe within the server rack. Consequently, the cooling liquid in the inner loop and the cooling liquid in the external loop can exchange heat through the distribution device without being mixed together.

For allowing the cooling liquid to be transmitted from the distribution device to the cold plates, the distribution device is equipped with a transport unit (e.g., a pump) and a storage unit (e.g., a water tank). The storage unit is used for storing the cooling liquid of the inner loop. The pump, the water tank and the water pipes are tightly connected with each other in order to prevent from the leakage of the cooling liquid and the damage of the device. Moreover, it is important to confirm the storage amount of the cooling liquid in the water tank. If the storage amount of the cooling liquid is insufficient, the heat dissipating efficiency of the loop is impaired and thus the temperature of the electronic component is too high.

However, since the inner space of the server is limited, the cooling liquid distribution device is usually fixed in the server. Consequently, it is difficult for the user to observe the storage amount of the cooling liquid in the storage unit (e.g., the water tank). Moreover, if the storage amount of the cooling liquid is insufficient, it is difficult for the user to replenish the water tank with the cooling liquid according to the conventional design. For example, the user has to disassemble the water tank from the distribution device to replenish the water tank with the cooling liquid.

Therefore, there is a need of providing an improved cooling liquid distribution device to overcome the drawbacks of the conventional technologies.

SUMMARY OF THE INVENTION

For solving the drawbacks of the conventional technologies, the present invention provides a cooling liquid distribution device for facilitating the user to realize the storage amount of the cooling liquid.

For solving the drawbacks of the conventional technologies, the present invention provides a cooling liquid distribution device with succinct and flat appearance. The cooling liquid distribution device can facilitate the user to realize the storage amount of the cooling liquid and replenish the storage tank with the cooling liquid.

In accordance with an aspect of the present invention, there is provided a cooling liquid distribution device for an electronic device. The cooling liquid distribution device includes a storage tank, a liquid level detector, a control module and a liquid level displaying structure. The storage tank includes a first chamber. A cooling liquid is stored in the first chamber. When a liquid level of the cooling liquid in the first chamber is detected by the liquid level detector, a liquid level detection result is generated. The control module is in communication with the liquid level detector. After the liquid level detection result is received and processed by the control module, the liquid level detection result is outputted for display. The liquid level displaying structure includes a second chamber. The second chamber is in fluid communication with the first chamber, so that a liquid level of the cooling liquid in the second chamber is equal to the liquid level of the cooling liquid in the first chamber. The liquid level displaying structure is optically transmissible, so that the liquid level of the cooling liquid in the second chamber is visible through the liquid level displaying structure.

In an embodiment, the liquid level detector is a submersible liquid level detector, a capacitive liquid level detector, an electrode-type liquid level detector, a radar-type liquid level detector or an ultrasonic liquid level detector, and the liquid level detector and the control module are in communication with each other in a wired transmission manner or a wireless transmission manner.

In an embodiment, the cooling liquid distribution device further includes a casing, and the control module is exposed outside the casing so as to be operated.

In an embodiment, the cooling liquid distribution device further includes a casing, and the casing includes a lateral plate. The storage tank is disposed within the casing and connected with the lateral plate. The liquid level displaying structure is connected with the lateral plate. The liquid level displaying structure and the storage tank are opposed to each other with respect to the lateral plate. The liquid level displaying structure is in fluid communication with the storage tank through a channel of the lateral plate.

In an embodiment, the storage tank includes a first opening, and the liquid level displaying structure includes a second opening. The first opening is in fluid communication with the first chamber. The second opening is in fluid communication with the first opening and the second chamber. The second opening is located at a bottom side of the liquid level displaying structure.

In an embodiment, the liquid level displaying structure further includes a third opening. The third opening is in fluid communication with the second chamber. The third opening is located at a top side of the liquid level displaying structure.

In an embodiment, the liquid level displaying structure further includes a dust-proof cover. The dust-proof cover is selectively assembled with or disassembled from the third opening.

In an embodiment, the liquid level displaying structure further includes a float ball. The float ball is accommodated within the second chamber. A density of the float ball is lower than a density of the float ball. Consequently, a position of the float ball is changed according to the liquid level of the cooling liquid in the second chamber.

In accordance with another aspect of the present invention, there is provided a cooling liquid distribution device for an electronic device. The cooling liquid distribution device includes a casing, a storage tank and a liquid level displaying structure. The casing is installed in a rack of the electronic device. The storage tank is disposed within the casing, and includes a first chamber. A cooling liquid is stored in the first chamber. The liquid level displaying structure includes a second chamber. The second chamber is in fluid communication with the first chamber, so that a liquid level of the cooling liquid in the second chamber is equal to the liquid level of the cooling liquid in the first chamber. The liquid level displaying structure is optically transmissible, so that the liquid level of the cooling liquid in the second chamber is visible through the liquid level displaying structure. A fluid communication site between the liquid level displaying structure and the storage tank is not beyond a layout region of the casing.

In an embodiment, the casing includes a lateral plate. The storage tank is disposed within the casing and connected with the lateral plate. The liquid level displaying structure is disposed within the lateral plate and connected with the storage tank. The liquid level displaying structure is exposed through a hollow portion of the lateral plate.

In an embodiment, the storage tank is disposed within the casing, and the storage tank and the casing have a shared lateral plate. The liquid level displaying structure is disposed within the lateral plate. The liquid level displaying structure is exposed through a hollow portion of the lateral plate.

In an embodiment, the storage tank includes a first opening, and the liquid level displaying structure includes a second opening. The first opening is in fluid communication with the first chamber. The second opening is in fluid communication with the first opening and the second chamber. The second opening is located at a bottom side of the liquid level displaying structure.

In an embodiment, the liquid level displaying structure further includes a third opening. The third opening is in fluid communication with the second chamber. The third opening is located at a top side of the liquid level displaying structure.

In an embodiment, the liquid level displaying structure further includes a dust-proof cover. The dust-proof cover is selectively assembled with or disassembled from the third opening.

In an embodiment, the liquid level displaying structure further includes a fourth opening, and the water tank further comprises a fifth opening. The fourth opening is in fluid communication with the second chamber. The fifth opening is in fluid communication with the fourth opening and the first chamber. The fourth opening is located near the third opening In accordance with the present invention, the user can realize the storage amount of the cooling liquid through the liquid level displaying structure. Due to the liquid level displaying structure, the cooling liquid distribution device has the succinct and flat appearance. Moreover, the user can replenish the storage tank with the cooling liquid through the liquid level displaying structure. The liquid level displaying structure includes the electronic-type liquid level detector and the physical liquid level displaying structure. Two liquid level gauges can allow the user to realize the liquid level or the storage amount of the cooling liquid in the storage tank. Moreover, the liquid level detection result of the two liquid level gauges can be provided to the user for comparison and reference. Even if one of the two liquid level gauges malfunctions, the liquid level detection result can still be realized by the user.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

Figure 1A:
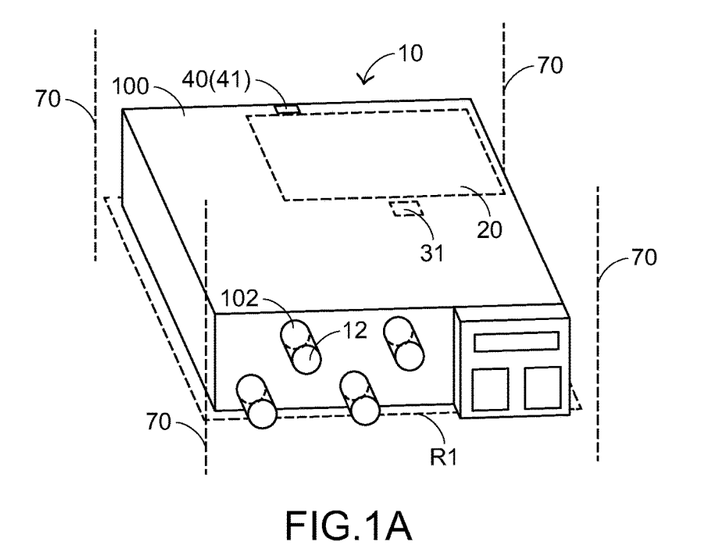
FIG. 1A is a schematic perspective view illustrating a cooling liquid distribution device according to a first embodiment of the present invention.
Figure 1B:
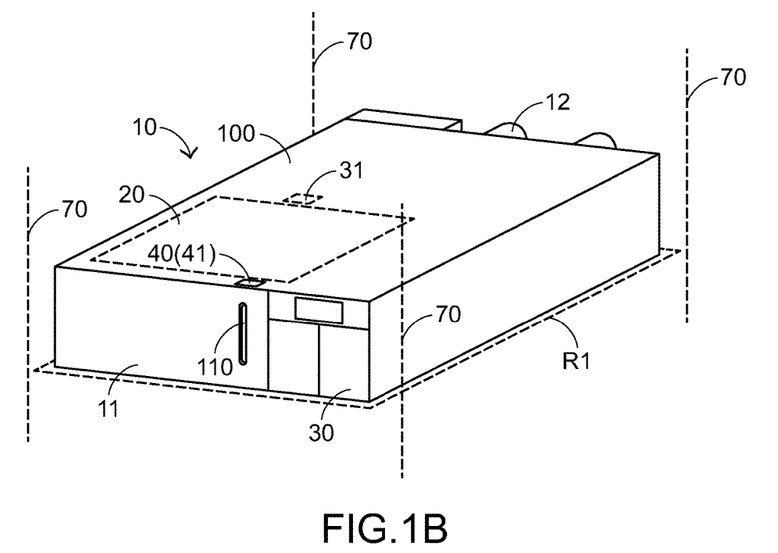
FIG. 1B is a schematic perspective view illustrating the cooling liquid distribution device according to the first embodiment of the present invention and taken along another viewpoint.

A cooling liquid distribution device according to a first embodiment of the present invention will be described as follows. Please refer to FIGS. 1A and 1B. FIG. 1A is a schematic perspective view illustrating a cooling liquid distribution device according to a first embodiment of the present invention. FIG. 1B is a schematic perspective view illustrating the cooling liquid distribution device according to the first embodiment of the present invention and taken along another viewpoint. In this embodiment, the cooling liquid distribution device 10 is applied to an electronic device (not shown). For example, the electronic device is a server. As shown in FIGS. 1A and 1B, the cooling liquid distribution device 10 is installed in a rack 70 of the electronic device.

In this embodiment, the cooling liquid distribution device 10 is installed in the rack 70 through a casing 100. The casing 100 of the cooling liquid distribution device 10 has a layout region R1. The layout region R1 is substantially the region that is circumscribed by the four posts of the rack 70, i.e., the region circumscribed by the dotted lines.

Like the conventional distribution device, the cooling liquid distribution device 10 of the present invention is capable of simultaneously outputting the cooling liquid to plural cold plates (not shown) of the rack 70. As shown in FIG. 1A, plural pipes 12 (e.g., four pipes) are penetrated through the perforations 102 of the casing 100. The cooling liquid is outputted from the cooling liquid distribution device 10 through the pipes 12 to exchange heat with the back-end heat dissipating mechanism. Consequently, the heat generated by the electronic components on the cold plates is removed by the cooling liquid.

Figure 2:
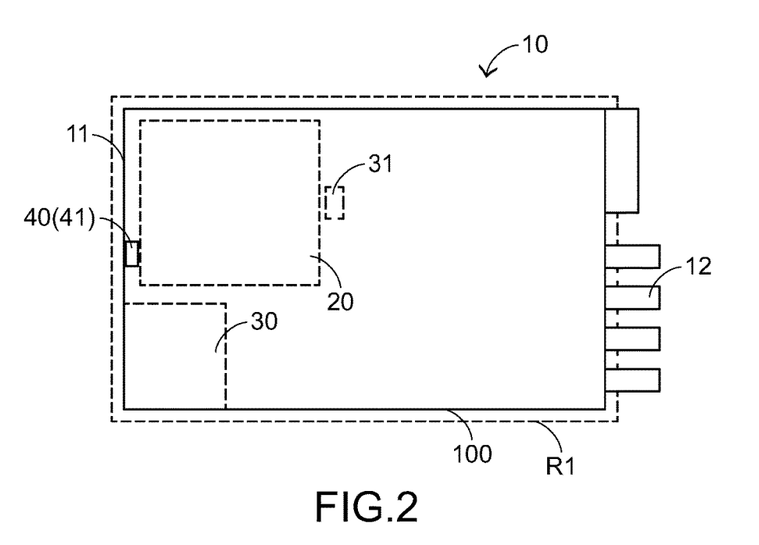
FIG. 2 is a schematic top view illustrating the cooling liquid distribution device according to the first embodiment of the present invention.

FIG. 2 is a schematic top view illustrating the cooling liquid distribution device according to the first embodiment of the present invention. The layout region R1 of casing 100 is also shown in FIG. 2. As known, the requisite pipes 12 have to be extended to the outside of the casing 100, or the control or signal transmission interfaces have to be protruded out from the casing 100. In accordance with the feature of the present invention, the arrangements of other components can still maintain the succinct and flat appearance of the casing 100. That is, the installation positions of other units are not beyond the layout region R1. The layout region R1 may be considered as a layout space of the casing 100. In such way, the overall allocation of the rack 70 or the server is not adversely affected by the installation of the cooling liquid distribution device 10.

Please refer to FIGS. 1A and 1B again. The cooling liquid distribution device 10 further comprises a storage tank 20, a liquid level detector 31, a control module 30 and a liquid level displaying structure 40. The storage tank 20 is disposed within the casing 100. The storage tank 20 comprises a first chamber 200 (see FIG. 3B). The first chamber 200 is used for storing a cooling liquid 60. The cooling liquid 60 flows along a circulating loop to remove heat. In accordance with a feature of this embodiment, the cooling liquid distribution device 10 has two components that are able to realize the liquid level of the cooling liquid 60 in the first chamber 200 or the storage amount of the cooling liquid 60 in the storage tank 20. These two components include the liquid level detector 31 and the liquid level displaying structure 40.

In an embodiment, the liquid level detector 31 is an electronic-type liquid level detector. That is, the liquid level detector 31 can be controlled at the back end, or the liquid level detector 31 can be executed automatically. Consequently, even if the cooling liquid 60 is not viewed by the human's eye, the liquid level can be detected by the liquid level detector 31. An example of the electronic-type liquid level detector 31 includes but is not limited to a submersible liquid level detector, a capacitive liquid level detector, an electrode-type liquid level detector, a radar-type liquid level detector or an ultrasonic liquid level detector.

As shown in FIGS. 1A, 1B and 2, the liquid level detector 31 is located beside the storage tank 20. It is noted that the position of the liquid level detector 31 is not restricted. That is, the position of the liquid level detector 31 may be determined according to the type of the liquid level detector 31. For example, in case that the liquid level detector 31 is the submersible liquid level detector, the liquid level detector 31 is disposed within the storage tank, especially submersed into the bottom side of the first chamber 200. Consequently, the liquid level detector 31 can detect the level of the cooling liquid 60 that is located over the liquid level detector 31. According to the practical applications, the other types of liquid level detectors may be located at the top side of the first chamber 200 (i.e., the position over the cooling liquid 60) or the inner wall of the first chamber 200.

The liquid level detector 31 is in communication with the control module 30. When the liquid level of the cooling liquid 60 is detected by the liquid level detector 31, a liquid level detection result is generated. A detection result signal containing the liquid level detection result is transmitted from the liquid level detector 31 to the control module 30. According to the type of the liquid level detector 31 or the function of the hardware design, the detection result signal is a wired signal or a wireless signal. That is, the liquid level detector 31 and the control module 30 are in communication with each other in a wired transmission manner or a wireless transmission manner. After the liquid level detection result is received and processed by the control module 30, the liquid level detection result is outputted for display.

In an embodiment, the liquid level detection result is a text message indicating the result of comparing the detected liquid level with a predetermined value. For example, the text message includes the message "Normal level" or the message "Low level". In another embodiment, the liquid level detection result is a digital message indicating the depth of the detected liquid storage amount or the liquid level.

As shown in FIG. 1B, the control module 30 is exposed outside the casing 100 to be operated by the user. That is, the user can directly operate the control module 30 to control the detection of the liquid level detector 31. Optionally, the control module 30 is further equipped with a display unit. After the rack 70 is exposed or the door of the server cabinet is opened, the detection result can be directly viewed through the display unit. It is noted that numerous modifications may be made while retaining the teachings of the present invention. For example, in another embodiment, the control module is not equipped with the display unit, or the entire of the control module is installed in the casing. Under this circumstance, the detection result is transmitted to a display device that is in communication with the control module. For example, the display device is a monitor of a computer system at the back end.

Since the liquid level detector 31 is the electronic type detector, the installation position of the liquid level detector 31 is not restricted. The installation position of the liquid level detector 31 is determined according to the type of the liquid level detector 31. For example, the liquid level detector 31 can be installed in a narrow space or an unseen place. Consequently, the liquid level detector 31 is suitably used in the cooling liquid distribution device or the storage tank. Moreover, since the liquid level detector 31 is the electronic type detector, it is not necessary to create so many openings in the storage tank or the casing. In such way, the possibility of causing leakage of the liquid is minimized. The detection result can be observed when the user is located near the storage tank. In addition, the detection result can be observed when the user is located at the remote back end.

In an embodiment, the liquid level displaying structure 40 is a physically mechanical design. That is, it is not necessary to provide electric power or signals to the liquid level displaying structure 40. Since the liquid level displaying structure 40 is in fluid communication with the storage tank 20, the liquid level of the cooling liquid 60 can be observed by the user's eyes. Please refer to FIGS. 1A, 1B and 2. In accordance with another feature of this embodiment, the liquid level displaying structure 40 is an embedded structure. That is, the liquid level displaying structure 40 is not protruded out of the casing 100. In other words, the fluid communication site between the liquid level displaying structure 40 and the storage tank 20 is not beyond the layout region R1 of the casing 100. Consequently, the cooling liquid distribution device 10 has the succinct and flat appearance.

Figure 3A:
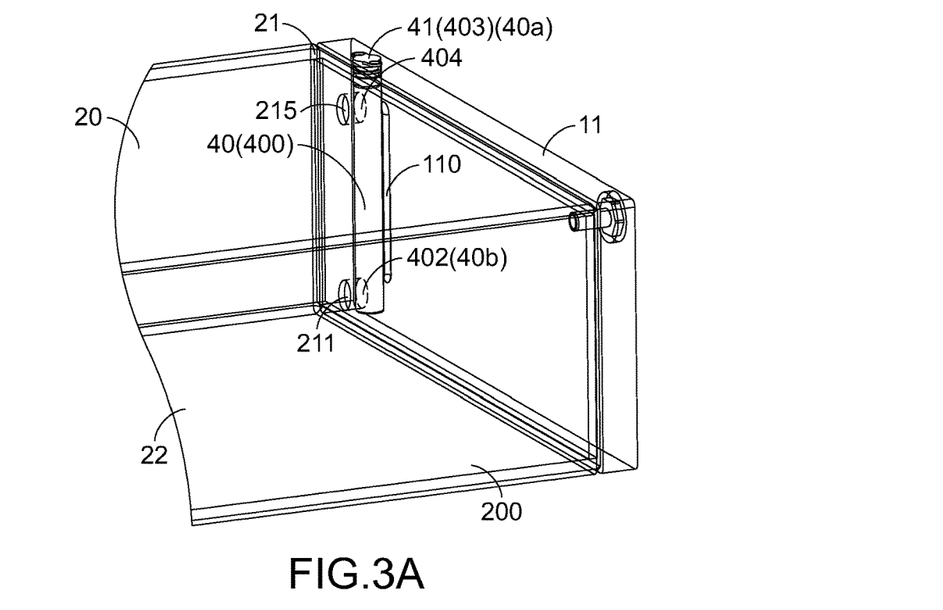
FIG. 3A is a schematic perspective view illustrating the fluid communication between the liquid level displaying structure and the storage tank of the cooling liquid distribution device according to the first embodiment of the present invention.
Figure 3B:
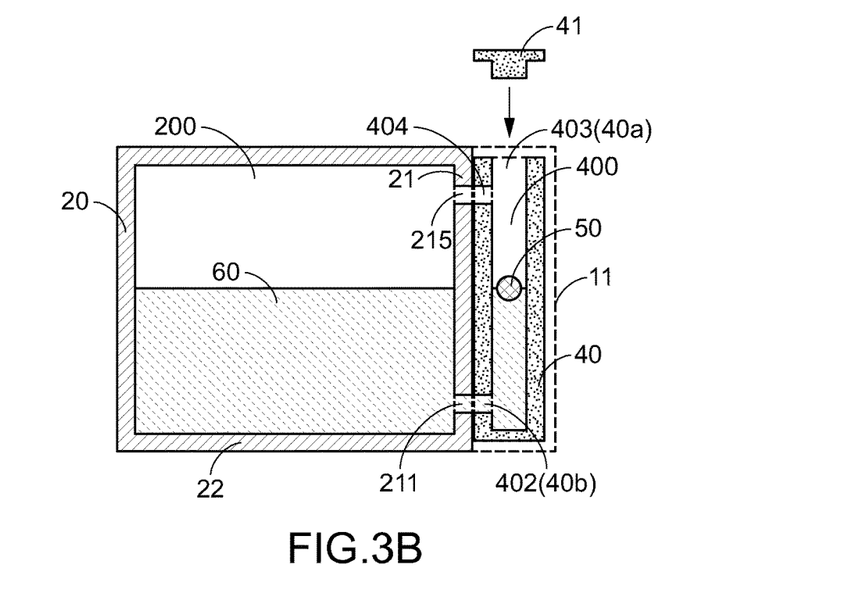
FIG. 3B is a schematic cross-sectional view illustrating the fluid communication between the liquid level displaying structure and the storage tank of the cooling liquid distribution device according to the first embodiment of the present.

Please refer to FIGS. 3A and 3B. FIG. 3A is a schematic perspective view illustrating the fluid communication between the liquid level displaying structure and the storage tank of the cooling liquid distribution device according to the first embodiment of the present invention. FIG. 3B is a schematic cross-sectional view illustrating the fluid communication between the liquid level displaying structure and the storage tank of the cooling liquid distribution device according to the first embodiment of the present. As shown in FIGS. 1A, 1B, 3A and 3B, the liquid level displaying structure 40 comprises a second chamber 400. The second chamber 400 is in communication with the first chamber 200. Consequently, the liquid level of the cooling liquid 60 in the first chamber 200 and the liquid level of the cooling liquid 60 in the second chamber 400 are equal. Moreover, the liquid level displaying structure 40 is optically transmissible. Consequently, the liquid level of the cooling liquid 60 in the second chamber 400 is visible through the liquid level displaying structure 40.

As mentioned above, the liquid level displaying structure 40 is the embedded structure. The casing 100 comprises a lateral plate 11. The storage tank 20 is disposed within the casing 100. Moreover, a backside plate 21 of the storage tank 20 is connected with the lateral plate 11. The liquid level displaying structure 40 is disposed within the lateral plate 11 and connected with the backside plate 21 of the storage tank 20. Moreover, the liquid level displaying structure 40 is exposed through a hollow portion 110 of the lateral plate 11. It is noted that the lateral plate 11 has an accommodation space for accommodating the embedded-type liquid level displaying structure 40.

Moreover, the storage tank 20 comprises a first opening 211. The first opening 211 is formed in the backside plate 21. Moreover, the first opening 211 is located near a bottom surface 22 of the storage tank 20. The first opening 211 is in fluid communication with the first chamber 200. The liquid level displaying structure 40 comprises a second opening 402. The second opening 402 is located at a bottom side of the liquid level displaying structure 40. The second opening 402 is in fluid communication with the second chamber 400.

As mentioned above, the liquid level displaying structure 40 is disposed within the lateral plate 11. In other words, the lateral plate 11 has a through-hole (not shown) corresponding to the second opening 402. Preferably, the liquid level displaying structure 40 within the lateral plate 11 is very close to or in direct contact with the backside plate 21. Consequently, the depth of the channel in the lateral plate 11 is reduced. Moreover, the position of the first opening 211 corresponds to the position of the second opening 402. Consequently, the second opening 402 is in fluid communication with the first opening 211. Under this circumstance, the first chamber 200 and the second chamber 400 are in fluid communication with each other.

When the bottom sides of plural containers are connected with each other, the pressures applied to the top sides of the containers are equal to the atmospheric pressure. According to the communicating pipe principle, the liquid introduce into the containers may flow to the adjacent containers until the liquid levels of all containers are equal. In other words, the liquid level of the cooling liquid 60 in the first chamber 200 and the liquid level of the cooling liquid 60 in the second chamber 400 are equal. Moreover, since the liquid level displaying structure 40 is made of the optically-transmissible material, the storage amount of the cooling liquid 60 can be observed by the user through the hollow portion 110 of the lateral plate 11.

Please refer to FIGS. 3A and 3B again. In accordance with another feature of this embodiment, the liquid level displaying structure 40 further comprises a third opening 403. The third opening 403 is in fluid communication with the second chamber 400. The third opening 403 is located at a top side 40a of the liquid level displaying structure 40. Moreover, the liquid level displaying structure 40 further comprises a dust-proof cover 41. The position and size of the dust-proof cover 41 match the position and size of the third opening 403. Consequently, the dust-proof cover 41 can be assembled with or disassembled from the third opening 403 by the user.

In case that the storage amount of the cooling liquid 60 in the storage tank 20 is insufficient (i.e., in the low liquid level state), the user may replenish the storage tank 20 with the cooling liquid 60. For replenishing the storage tank 20 with the cooling liquid 60, the user has to disassemble the dust-proof cover 41 from the third opening 403 and pour the designated cooling liquid into the second chamber 400 through the third opening 403. As mentioned above, the lateral plate 11 is located at the periphery of the cooling liquid distribution device 10. Consequently, after the rack 70 is exposed or the door of the server cabinet is opened, the user can replenish the storage tank 20 with the cooling liquid easily. That is, it is not necessary to disassemble the storage tank 20 from the cooling liquid distribution device 10.

Please refer to FIGS. 3A and 3B again. In accordance with another feature of the present invention, the liquid level displaying structure 40 further comprises a float ball 50. The float ball 50 is accommodated within the second chamber 400. The density of the float ball 50 is lower than the density of the float ball 50. Consequently, the position of the float ball 50 is changed according to the liquid level of the cooling liquid 60 in the second chamber 400. As mentioned above, the liquid level of the cooling liquid 60 in the second chamber 400 can be observed by the user through the hollow portion 110 of the lateral plate 11. Moreover, since the float ball 50 is floated to the top of the cooling liquid 60, the user can realize the storage amount of the cooling liquid 60 in the storage tank 20 more clearly and instantly through the float ball 50.

Please refer to FIGS. 3A and 3B again. In accordance with another feature of the present invention, the liquid level displaying structure 40 further comprises a fourth opening 404. The fourth opening 404 is in fluid communication with the second chamber 400. Moreover, a fifth opening 215 is formed in the backside plate 21 of the storage tank 20. The fifth opening 215 is in fluid communication with the first chamber 200. The relationship between the fourth opening 404 and the fifth opening 215 is similar to the relationship between the second opening 402 and the first opening 211. However, the fourth opening 404 is located near the third opening 403, i.e., near the top side 40a of the liquid level displaying structure 40.

As mentioned above, the position of the fifth opening 215 corresponds to the position of the fourth opening 404. Since the fourth opening 404 is in fluid communication with the fifth opening 215, the first chamber 200 is in fluid communication with the second chamber 400. Moreover, the fourth opening 404 and the fifth opening 215 are located near the near the top side 40a of the liquid level displaying structure 40. Consequently, when the space over the top of the cooling liquid 60 is occupied by air, the air can flow through the fourth opening 404 and the fifth opening 215.

While the cooling liquid is poured into the second chamber 400 through the third opening 403 to replenish the storage tank 20, the liquid level of the cooling liquid 60 is gradually increased. As the liquid level of the cooling liquid 60 is increased, the air in the first chamber 200 is exhausted to the second chamber 400 through the fifth opening 215 and the fourth opening 404 and outputted to the surroundings through the third opening 403. Due to the arrangement of the fourth opening 404 and the fifth opening 215, the cooling liquid can be replenished and poured more smoothly.

It is noted that numerous modifications and alterations may be made while retaining the teachings of the invention. For example, in another embodiment, the storage tank and the casing have a shared lateral plate. That is, the storage tank is not equipped with the backside plate 21 as shown in FIGS. 3A and 3B, and the lateral plate 11 is shared by the storage tank and the casing. Consequently, the openings are only formed in the liquid level displaying structure. In other words, the first chamber of the storage tank is defined by the lateral plate.

In case that the storage tank and the lateral plate are produced individually and combined together, a seam is possibly formed in the junctions between these two components. Under this circumstance, a problem of leaking the cooling liquid may occur. Preferably, the storage tank is integrally formed with the lateral plate. Consequently, the leakage problem is overcome.

Figure 4:
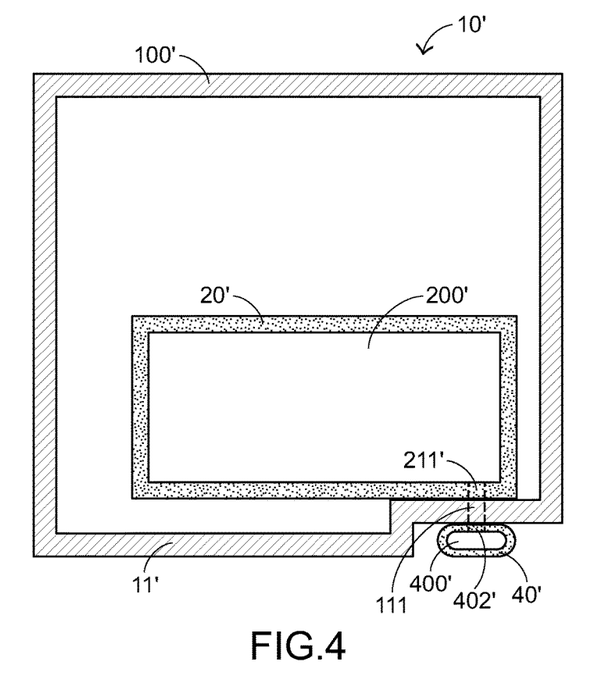
FIG. 4 is a schematic top and cross-sectional view illustrating a cooling liquid distribution device according to a second embodiment of the present invention.

A cooling liquid distribution device according to a second embodiment of the present invention will be described as follows. FIG. 4 is a schematic top and cross-sectional view illustrating a cooling liquid distribution device according to a second embodiment of the present invention. Component parts and elements corresponding to those of the first embodiment are designated by identical numeral references, and detailed descriptions thereof are omitted. In comparison with the first embodiment, the position of the liquid level displaying structure 40' of the cooling liquid distribution device 10' is distinguished. The liquid level displaying structure 40' is not disposed within the lateral plate 11' of the casing 100'. The liquid level displaying structure 40' is connected with the lateral plate 11'. Moreover, the liquid level displaying structure 40' and the storage tank 20' are opposed to each other with respect to the lateral plate 11'. Moreover, the liquid level displaying structure 40' is in fluid communication with the storage tank 20' through a channel 111 of the lateral plate 11'.

The first opening 211' of the storage tank 20', the channel 111 of the lateral plate 11' and the second opening 402' of the liquid level displaying structure 40' are aligned with each other and connected with each other. Since the first chamber 200' of the storage tank 20' and the second chamber 400' of the liquid level displaying structure 40' are in fluid communication with each other, the liquid level of the cooling liquid in the first chamber 200' and the liquid level of the cooling liquid in the second chamber 400' are equal. In this embodiment, the liquid level displaying structure 40' is disposed on the outer surface of the casing 100' and beyond the layout region or space of the casing 100'. As shown in FIG. 4, the lateral plate 11' has a concave structure corresponding to the liquid level displaying structure 40'. The liquid level displaying structure 40' is accommodated within the concave structure. Consequently, the cooling liquid distribution device 10' still has the succinct and flat appearance.

In the above embodiments, the liquid distribution device comprises two liquid level gauges for allowing the user to realize the liquid level or the storage amount of the cooling liquid in the storage tank. Generally, the two liquid level gauges show the same liquid level detection result. The liquid level detection result of the two liquid level gauges can be provided to the user for comparison and reference. Even if one of the two liquid level gauges malfunctions, the liquid level detection result can still be realized by the user. The liquid level displaying structure is a physically mechanical design. Since the liquid level displaying structure can be independently operated in the cooling liquid distribution device, the electron-type liquid level detector may be omitted.

From the above descriptions, the present invention provides a cooling liquid distribution device. The cooling liquid distribution device can facilitate the user to realize the storage amount of the cooling liquid or facilitate the user to replenish the storage tank with the cooling liquid. Since the cooling liquid distribution device is effective to solve the drawbacks of the conventional technologies, the objects of the present invention are achievable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. A cooling liquid distribution device for an electronic device, the cooling liquid distribution device comprising:
    a storage tank comprising a first chamber, wherein a cooling liquid is stored in the first chamber;

a liquid level detector, wherein when a liquid level of the cooling liquid in the first chamber is detected by the liquid level detector, a liquid level detection result is generated;

a control module in communication with the liquid level detector, wherein after the liquid level detection result is received and processed by the control module, the liquid level detection result is outputted for display; and a liquid level displaying structure comprising a second chamber, wherein the second chamber is in fluid communication with the first chamber, so that a liquid level of the cooling liquid in the second chamber is equal to the liquid level of the cooling liquid in the first chamber, wherein the liquid level displaying structure is optically transmissible, so that the liquid level of the cooling liquid in the second chamber is visible through the liquid level displaying structure.

2. The cooling liquid distribution device according to claim 1, wherein the liquid level detector is a submersible liquid level detector, a capacitive liquid level detector, an electrode-type liquid level detector, a radar-type liquid level detector or an ultrasonic liquid level detector, and the liquid level detector and the control module are in communication with each other in a wired transmission manner or a wireless transmission manner.

3. The cooling liquid distribution device according to claim 1, wherein the cooling liquid distribution device further comprises a casing, and the control module is exposed outside the casing so as to be operated.

4. The cooling liquid distribution device according to claim 1, wherein the cooling liquid distribution device further comprises a casing, and the casing comprises a lateral plate, wherein the storage tank is disposed within the casing and connected with the lateral plate, the liquid level displaying structure is connected with the lateral plate, the liquid level displaying structure and the storage tank are opposed to each other with respect to the lateral plate, and the liquid level displaying structure is in fluid communication with the storage tank through a channel of the lateral plate.

5. The cooling liquid distribution device according to claim 1, wherein the storage tank comprises a first opening, and the liquid level displaying structure comprises a second opening, wherein the first opening is in fluid communication with the first chamber, the second opening is in fluid communication with the first opening and the second chamber, and the second opening is located at a bottom side of the liquid level displaying structure.

6. The cooling liquid distribution device according to claim 1, wherein the liquid level displaying structure further comprises a third opening, wherein the third opening is in fluid communication with the second chamber, and the third opening is located at a top side of the liquid level displaying structure.

7. The cooling liquid distribution device according to claim 6, wherein the liquid level displaying structure further comprises a dust-proof cover, wherein the dust-proof cover is selectively assembled with or disassembled from the third opening.

8. The cooling liquid distribution device according to claim 1, wherein the liquid level displaying structure further comprises a float ball, and the float ball is accommodated within the second chamber, wherein a density of the float ball is lower than a density of the float ball, so that a position of the float ball is changed according to the liquid level of the cooling liquid in the second chamber.

9. A cooling liquid distribution device for an electronic device, the cooling liquid distribution device comprising:

a casing installed in a rack of the electronic device;

a storage tank disposed within the casing, and comprising a first chamber, wherein a cooling liquid is stored in the first chamber; and a liquid level displaying structure comprising a second chamber, wherein the second chamber is in fluid communication with the first chamber, so that a liquid level of the cooling liquid in the second chamber is equal to the liquid level of the cooling liquid in the first chamber, wherein the liquid level displaying structure is optically transmissible, so that the liquid level of the cooling liquid in the second chamber is visible through the liquid level displaying structure, wherein a fluid communication site between the liquid level displaying structure and the storage tank is not beyond a layout region of the casing.

10. The cooling liquid distribution device according to claim 9, wherein the casing comprises a lateral plate, wherein the storage tank is disposed within the casing and connected with the lateral plate, the liquid level displaying structure is disposed within the lateral plate and connected with the storage tank, and the liquid level displaying structure is exposed through a hollow portion of the lateral plate.

11. The cooling liquid distribution device according to claim 9, wherein the storage tank is disposed within the casing, and the storage tank and the casing have a shared lateral plate, wherein the liquid level displaying structure is disposed within the lateral plate, and the liquid level displaying structure is exposed through a hollow portion of the lateral plate.

12. The cooling liquid distribution device according to claim 9, wherein the storage tank comprises a first opening, and the liquid level displaying structure comprises a second opening, wherein the first opening is in fluid communication with the first chamber, the second opening is in fluid communication with the first opening and the second chamber, and the second opening is located at a bottom side of the liquid level displaying structure.

13. The cooling liquid distribution device according to claim 9, wherein the liquid level displaying structure further comprises a third opening, wherein the third opening is in fluid communication with the second chamber, and the third opening is located at a top side of the liquid level displaying structure.

14. The cooling liquid distribution device according to claim 13, wherein the liquid level displaying structure further comprises a dust-proof cover, wherein the dust-proof cover is selectively assembled with or disassembled from the third opening.

15. The cooling liquid distribution device according to claim 13, wherein the liquid level displaying structure further comprises a fourth opening, and the water tank further comprises a fifth opening, wherein the fourth opening is in fluid communication with the second chamber, the fifth opening is in fluid communication with the fourth opening and the first chamber, and the fourth opening is located near the third opening.

* * * * *